United States Patent
Le et al.

(10) Patent No.: US 7,151,677 B2
(45) Date of Patent: Dec. 19, 2006

(54) MOVABLE STANDOFF FOR MOUNTING A CIRCUIT BOARD

(75) Inventors: Bao G. Le, Orange, CA (US); Derek T. Nguyen, San Clemente, CA (US); David R. Davis, Jefferson, SD (US); Allan L. Klink, Sioux City, IA (US)

(73) Assignee: Gateway Inc., Irvine, CA (US)

( * ) Notice: Subject to any disclaimer, the term of this patent is extended or adjusted under 35 U.S.C. 154(b) by 0 days.

(21) Appl. No.: 10/828,038

(22) Filed: Apr. 20, 2004

(65) Prior Publication Data

US 2004/0196637 A1   Oct. 7, 2004

Related U.S. Application Data

(63) Continuation of application No. 10/142,040, filed on May 9, 2002, now Pat. No. 6,813,161.

(51) Int. Cl.
H05K 7/02 (2006.01)
H05K 7/04 (2006.01)

(52) U.S. Cl. ............... 361/807; 361/810; 361/760; 174/138 D; 174/138 G

(58) Field of Classification Search ............... 361/807, 361/810, 760, 730, 752, 790, 797, 800; 174/138
See application file for complete search history.

(56) References Cited

U.S. PATENT DOCUMENTS

| | | | |
|---|---|---|---|
| 2,696,765 A | 12/1954 | Appleton | |
| 3,640,399 A * | 2/1972 | Hartman | 211/175 |
| 4,308,961 A | 1/1982 | Kunce | |
| 4,478,331 A * | 10/1984 | Ruin | 206/707 |
| 4,925,392 A | 5/1990 | Himes, Jr. et al. | |
| 5,129,510 A * | 7/1992 | Wright | 206/6.1 |
| 5,516,089 A | 5/1996 | Seniff et al. | |
| 5,661,640 A | 8/1997 | Mills et al. | |
| 5,838,538 A * | 11/1998 | Yee | 361/683 |
| 5,963,432 A | 10/1999 | Crowley | |
| 6,027,191 A | 2/2000 | Korinsky et al. | |
| 6,089,878 A | 7/2000 | Meng | |
| 6,111,746 A | 8/2000 | Wahl et al. | |
| 6,116,950 A | 9/2000 | Koseki | |
| 6,164,634 A | 12/2000 | Farlow | |
| 6,331,940 B1 | 12/2001 | Lin | |
| 6,377,445 B1 | 4/2002 | Davis et al. | |

(Continued)

FOREIGN PATENT DOCUMENTS

DE   94 10 855 U   9/1994

(Continued)

OTHER PUBLICATIONS

Summers, Mark: Pedestal Support for Cots PCBS Parallel to a Surface—Motorola Technical Developments, Motorola Inc—vol. 38, pp. 278-280 XP000906123.

*Primary Examiner*—Kamand Cuneo
*Assistant Examiner*—Hung S. Bui
(74) *Attorney, Agent, or Firm*—Jeffrey A. Proehl; Woods Fuller Shultz & Smith PC

(57) ABSTRACT

An apparatus and method for supporting a circuit board within a computer chassis is disclosed. The apparatus comprises a standoff support mounted in a channel so that the standoff can be positioned along the length of the channel by moving or sliding the standoff within the channel. This movable standoff facilitates the mounting of a variety of circuit boards within the same computer chassis.

16 Claims, 5 Drawing Sheets

U.S. PATENT DOCUMENTS 6,385,050 B1    5/2002   Orita et al.
6,398,043 B1    6/2002   Wark et al.
6,411,517 B1 *  6/2002   Babin .......................... 361/759
6,974,914 B1 * 12/2005   Taylor et al. ............... 174/250

FOREIGN PATENT DOCUMENTS

DE           201 12 594 U      1/2002

* cited by examiner

A — — — — — — — — A'

1

MOVABLE STANDOFF FOR MOUNTING A CIRCUIT BOARD

REFERENCE TO RELATED APPLICATION

This application is a continuation of U.S. patent application Ser. No. 10/142,040, filed May 9, 2002 now U.S. Pat. No. 6,813,161.

FIELD OF THE INVENTION

The present invention relates generally to the manufacture of electronic devices and more specifically to the mounting of a circuit board within a chassis using a standoff.

BACKGROUND OF THE INVENTION

All computer chassis are designed to fit different motherboards therein. Within a chassis, a slot in the chassis generally supports one end of a motherboard, and a rigidly fixed metal standoff is either pressed or screwed into the chassis. The position of the rigidly fixed standoff is predetermined by the geometry of the motherboard and location of a mounting hole therein. Alternatively, the motherboard may be manufactured to fit within the chassis accordingly. The position of the rigidly fixed standoff must be such that when the motherboard is in the slot, the mounting hole aligns with the standoff. The standoff is then inserted into the mounting hole.

Motherboards vary in size and may have mounting holes in varying locations with respect to the computer chassis when mounted. This causes inefficiencies in the production of electronic devices, such as computers, because the position of a standoff within a computer chassis might be disposed to support a motherboard of one size or type, but not another. For instance, the standoffs for the motherboards of GATEWAY™, FLEX™, and MICRO™ are close together, but not in the same position. As a result, generally a chassis must be custom built to match a specific type of motherboard—a practice that is both inconvenient and cost inefficient. For example, a company must project sales of a particular product in order to determine how many custom chassis to build of a particular type. But incorrect projections often result in either a surplus of unsold product or an inability to meet market demand. As such, it would be more convenient and cost effective to build a chassis capable of housing more than one product or motherboard type. Therefore, one alternative has been to fix two or more standoffs within the same chassis. Fixing multiple standoffs, however, is also inconvenient and cost inefficient because the unused standoffs must be removed later in production. Thus, there is a need to be able to mount different motherboards within the same computer chassis.

SUMMARY OF THE INVENTION

In general, a slidable standoff is positioned by moving it within a channel of a mounting assembly that mounts the standoff to a chassis. By being slidable, the standoff may be positioned to accommodate different types and sizes of motherboards.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. Moreover, in the figures, like reference numerals designate corresponding parts throughout the different views. However, like parts do not always have like reference numerals. Moreover, all illustrations are intended to convey concepts, where relative sizes, shapes and other detailed attributes may be illustrated schematically rather than literally or precisely.

DETAILED DESCRIPTION OF THE INVENTION

Figure 1A:
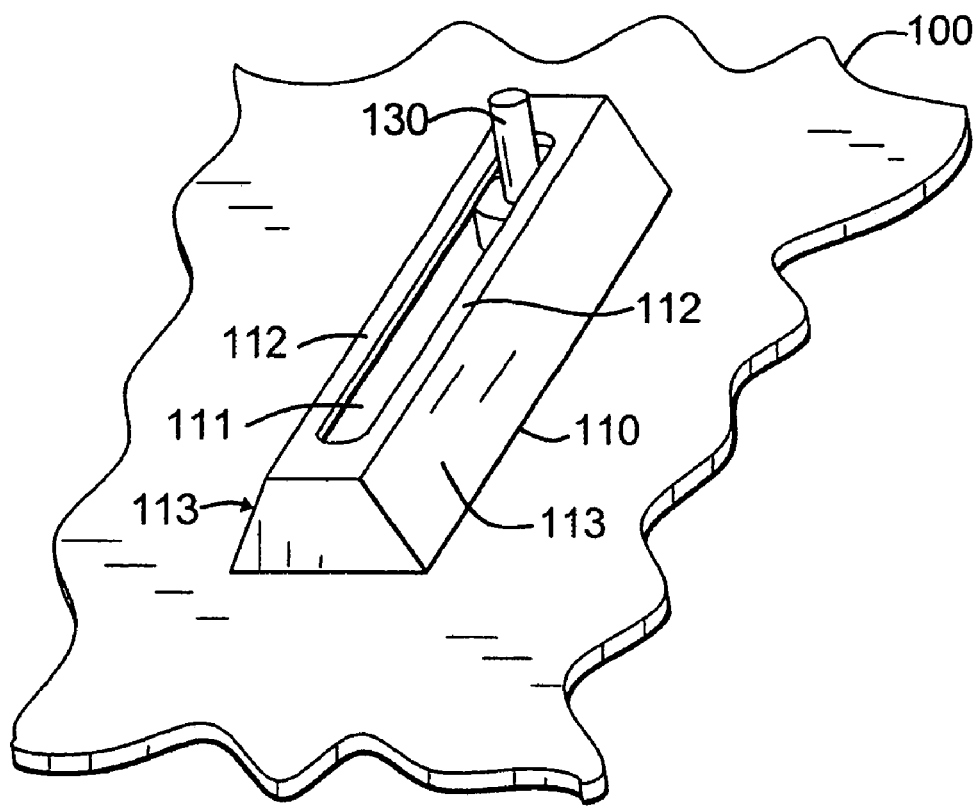
FIG. 1A is a representation of a perspective view of an example mounting assembly having a slidable standoff in a first position.
Figure 1B:
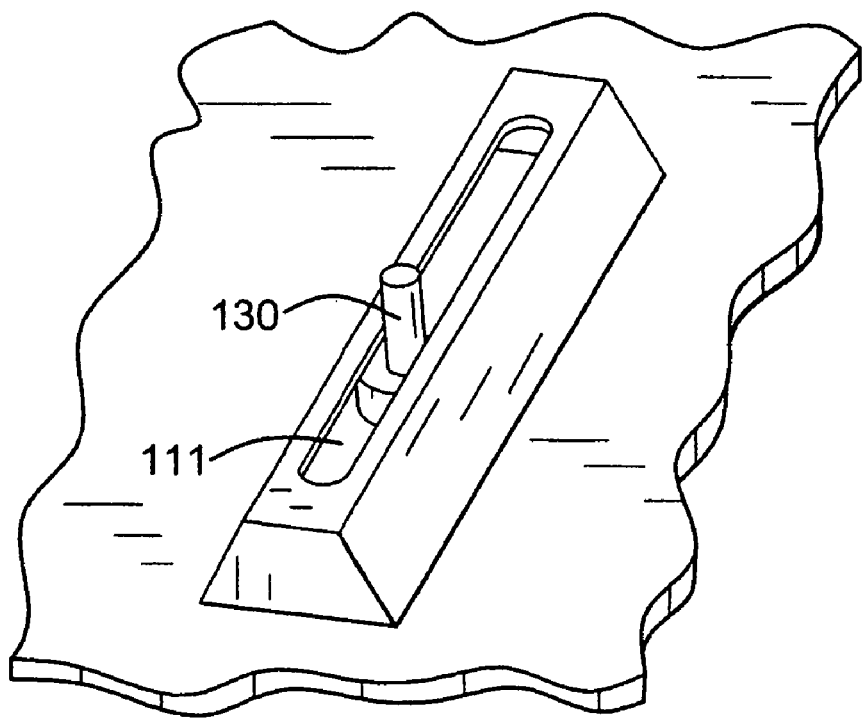
FIG. 1B is a representation of a perspective view of an example mounting assembly having a slidable standoff in a second position.

Referring to FIG. 1A, an example embodiment of a mounting assembly 110 is fixed to a chassis 100. In an aspect of an embodiment, the mounting assembly comprises a housing that has a top wall including opposed raised ridge portions 112 and has opposed walls 113. The raised ridge portions 112 provide a channel 111 configured to slidably receive a standoff 130, thus allowing the standoff 130 to be positioned therein at various locations by sliding along the channel 111. The channel 111 includes an elongate slot in the top wall between the raised ridge portions 112. FIG. 1A depicts the standoff 130 in an initial position before sliding to a second position along the channel 111. FIG. 1B depicts the standoff 130 in the second position after sliding along the channel 111.

Figure 1C:
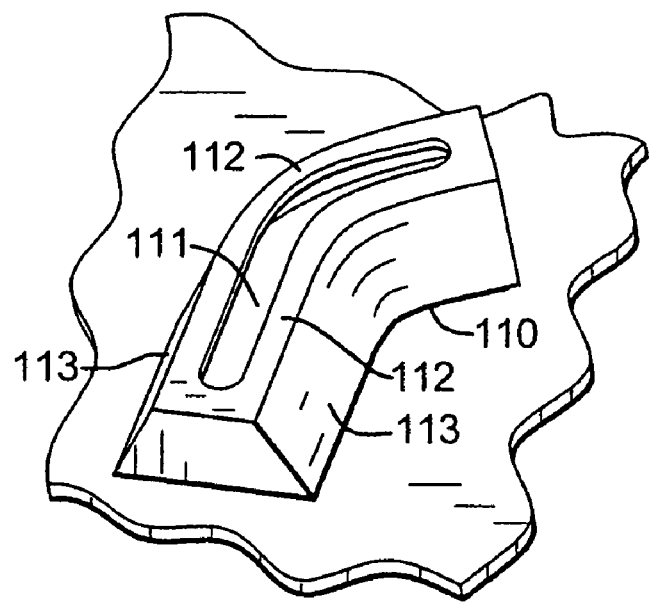
FIG. 1C is a representation of a perspective view of an example mounting assembly wherein the channel is curved.
Figure 1D:
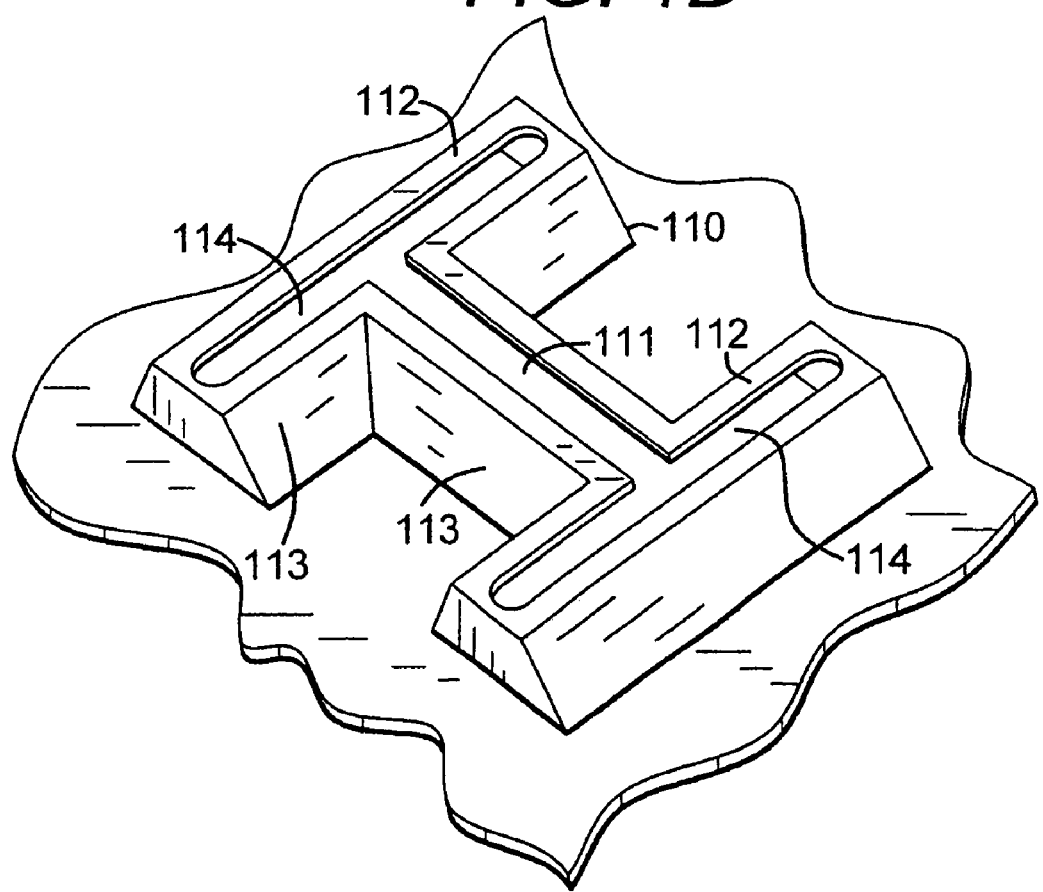
FIG. 1D is a representation of a perspective view of an example mounting assembly having multiple ridge portions and multiple walls forming a channel that intersects at perpendicular angles with two channels.

Referring to FIG. 1C, a mounting assembly 110 may have curved raised ridge portions 112 and curved walls 113 to form a substantially curved channel 111, as in this example, forming a J-shaped curve. Alternatively, referring to FIG. 1D, the mounting assembly 110 may have multiple raised ridge portions 112 and multiple walls 113 to form a straight channel 111 that intersects at perpendicular angles with two or more channels 114. The raised ridge portions 112 and walls 113 are not limited to a substantially straight shape as depicted in FIGS. 1A, 1B, and 1D. Therefore, any of the channels 111, 114 may be straight, curved, or have any desired shape or pattern. The channels 111 may intersect with one or more channels 114 at different angles. For example, the mounting assembly 110 may have a channel with a figure-8 shape.

Figure 2:
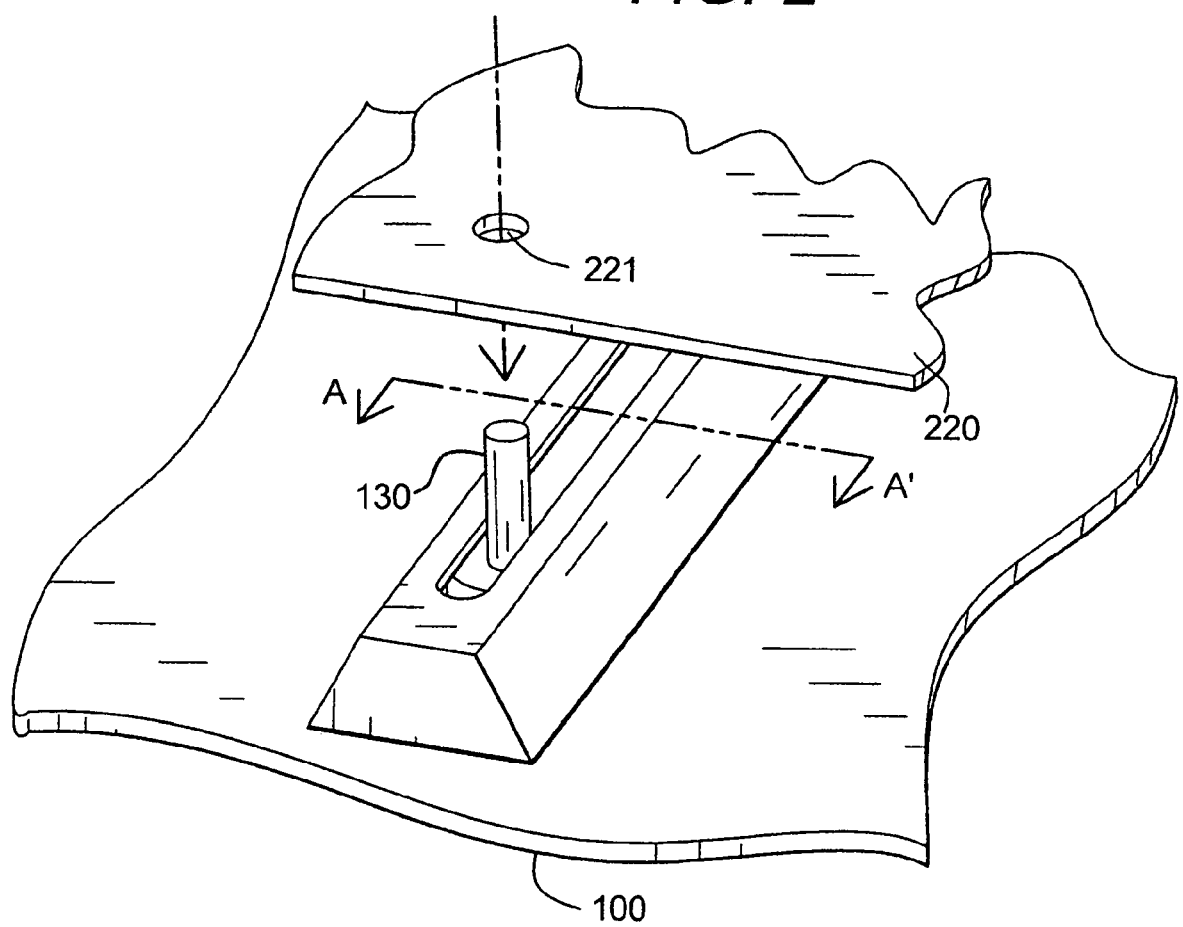
FIG. 2 is a representation of an exploded perspective view of an example mounting assembly wherein the standoff is positioned to be received by the mounting hole of the motherboard.

Referring to FIG. 2, depending on the location of the mounting hole 221 on a particular type of circuit board 220, the second position of the standoff 130 can be selected to accommodate the support of that particular type of circuit board 220. Circuit board 220 may be any kind of circuit board such as a motherboard. For example, a desired position can be determined such that when the circuit board 220 is mounted on the chassis 100, the mounting hole 221 aligns with the standoff 130. The standoff 130 is then in a position to be received within the mounting hole 221 of the circuit board 220.

One advantage of a slidable standoff on a circuit board is that the slidable standoff will facilitate the mounting of a variety of different circuit boards on the same computer chassis. Thus, the slidable standoff eliminates the need to build separate lines of custom chassis having fixed standoffs. Alternatively, the slidable standoff eliminates the need to install multiple fixed standoffs within a chassis, wherein unused standoffs must be removed later in production.

Figure 3A:
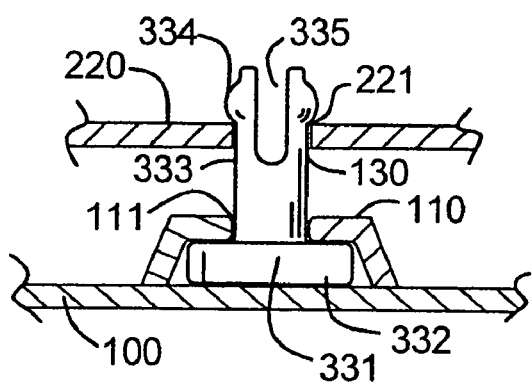
FIG. 3A is a representation of a cross-section view of the mounting assembly taken along line AA' of FIG. 2 and side view of the standoff, wherein the standoff has a post with a detent and groove.

There are a variety of standoff embodiments. Some examples are provided below. Referring to FIG. 3A, in an example embodiment, a standoff 130, positioned in a channel 111 of a mounting assembly 110 fixed to a chassis 100, may have a base 331 and a flared portion 332 to secure the standoff 130 within the mounting assembly 110 while allowing the standoff 130 to be slidably moved along the channel 111. In addition, the standoff 130 may have a post 333 with a detent 334 and groove 335. The groove 335 allows the detent 334 to be pressed inward toward the center of the standoff post 333. When a mounting hole 221 on a circuit board 220 is aligned with the standoff 130, the mounting hole 221 is fitted over the detent 334 in order to secure the circuit board 220 to the standoff 130. Upon application of upward pressure on the circuit board 220, the groove 335 in the post 333 facilitates the release of the circuit board 220 from the detent 334 so that the circuit board 220 can be removed. The sliding standoff 130 is preferably made of plastic or a non-metal, but can be made of metal if desired. Thus, the sliding standoff has a post that supports the circuit board, the post having a top end with a detent and groove. The groove allows for the detent to be pressed inward toward the center of the post. The circuit board can thus be secured to the standoff by fitting a mounting hole over the detent. Furthermore, upon application of upward pressure on the circuit board, the groove facilitates the detent's release of the circuit board so that the circuit board can be removed.

Figure 3B:
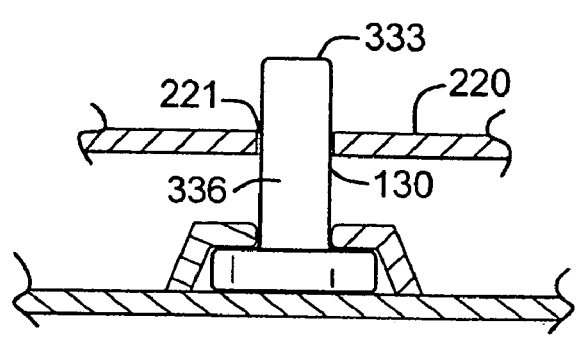
FIG. 3B is a representation of a cross-section view of the mounting assembly taken along line AA' of FIG. 2 and side view of the standoff, wherein the standoff has a post without protrusions or intrusions.

Referring to FIG. 3B, in another example embodiment, the smooth standoff post 336 over which the mounting hole 221 is fit has no protrusions or intrusions. In supporting the circuit board 220, the post 333 does not secure the circuit board 220 to the standoff 130.

Figure 3C:
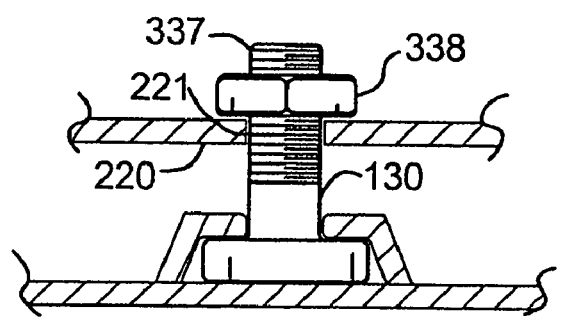
FIG. 3C is a representation of a cross-section view of the mounting assembly taken along line AA' of FIG. 2 and side view of the standoff, wherein the standoff has a threaded post with a nut.

Referring to FIG. 3C, in yet another example embodiment, the standoff 130 has a threaded post 337. The mounting hole 221 of the circuit board 220 is fitted over the threaded post 337 to support the circuit board 220. A nut 338 is then installed over the circuit board 220 to secure the circuit board 220 to the standoff 130. The sliding standoff 130 can be made of plastic, metal, or a non-metal. Where the standoff is plastic, electrical insulation of the circuit board would be provided so as to not cause any electrical shorting.

Figure 3D:
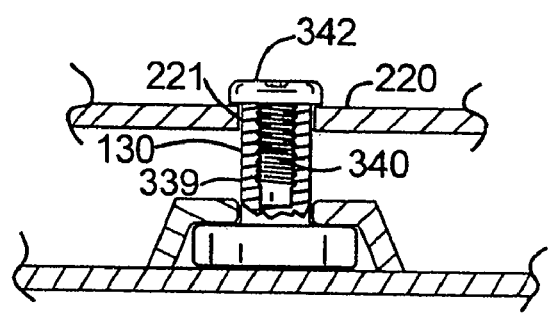
FIG. 3D is a representation of a cross-section view of the mounting assembly taken along line AA' of FIG. 2 and side view of the standoff, wherein the standoff has a 6-32 tap with a 6-32 screw installed.

Referring to FIG. 3D, in still another example embodiment, a tapped post 339 of the standoff 130 has a 6-32 tap 340. The mounting hole 221 of the circuit board 220 is fitted over the tapped post 339 to support the circuit board 220. The 6-32 screw 342 is then installed to the tap 340 in order to secure the circuit board 220 to the standoff 130. Preferably, the 6-32 screw 342 and standoff 130 are made of metal. If required, the metal tap allows for chassis grounding. However, non-metal materials may also be used. Although a 6-32 screw 342 is standard in the packaging of electronic devices, those of ordinary skill in the art will readily appreciate that screws of other sizes and shapes may be used. Therefore, the use of the 6-32 tap 340 and screw 342 in this embodiment does not limit the spirit or scope of the claims.

Figure 4A:
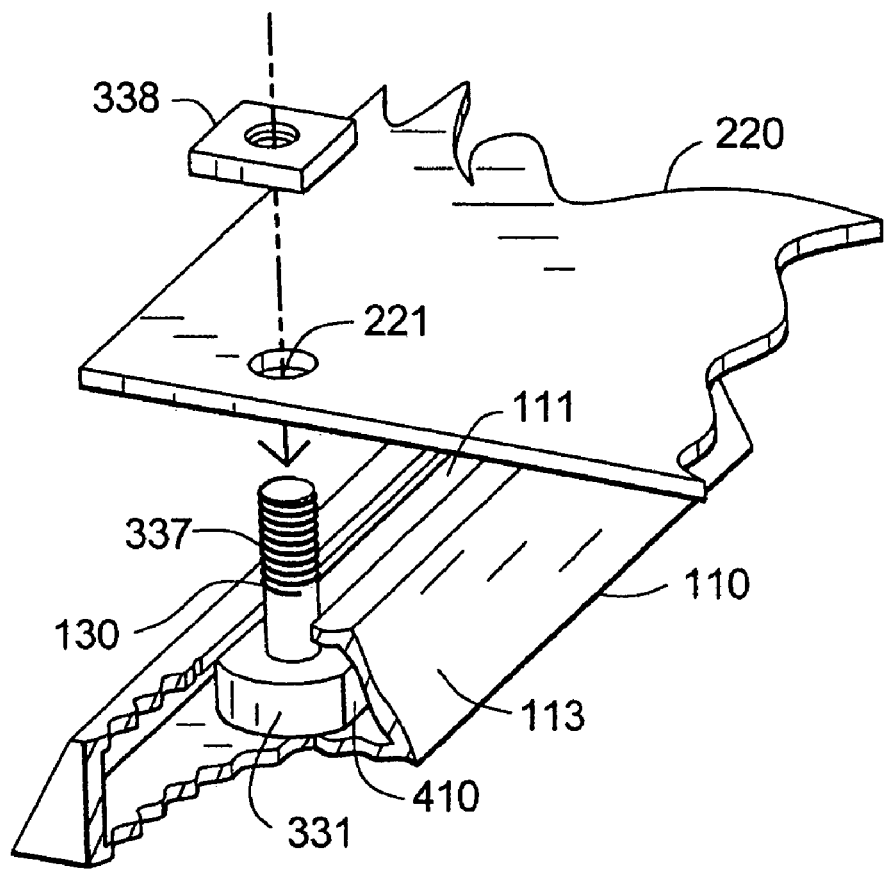
FIG. 4A is a representation of an exploded broken-out section view of an example mounting assembly wherein the standoff base has a flat face in contact with the interior wall of the mounting assembly.

Referring to FIG. 4A, in another example embodiment, a standoff 130 with a base 331 having a flat or semi-flat face 410 is secured in a channel 111 of a mounting assembly 110. The flat semi-flat face 410 is in contact with the interior of the mounting assembly wall 113, thus, securing the standoff 130 within the channel 111. In this embodiment, as in FIG. 3C, the standoff 130 has a threaded post 337, and the mounting hole 221 of the circuit board 220 is fitted over the threaded post 337 and secured with a nut 338.

Figure 4B:
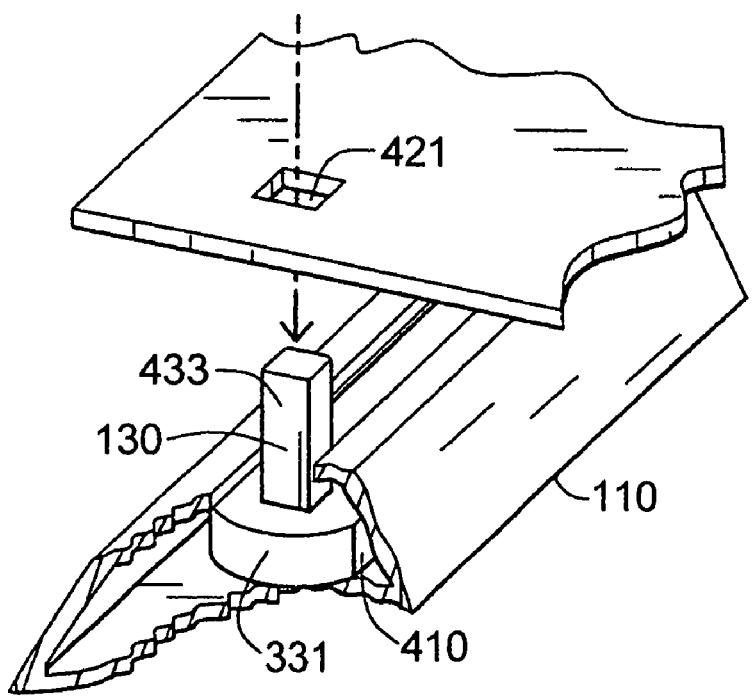
FIG. 4B is a representation of an exploded broken-out section view of an example mounting assembly wherein the non-annular post of the standoff is positioned to be received by the non-annular mounting hole of the mounting assembly.

Referring to FIG. 4B, in yet another example embodiment, the standoff 130 has a non-annular post 433 and is positioned to be received by the non-annular mounting hole 421 of the mounting assembly 110. As in this embodiment, the post 433 of the standoff 130 need not be annular. For example, the mounting hole 421 and post 433 may have four straight sides, forming a square, as depicted in FIG. 4B. Alternatively, the mounting hole 421 and post 433 may be of a shape or configuration other than those shown in the figures, as those of ordinary skill in the art will readily appreciate. Therefore, the shapes and configurations of the mounting hole 421 and post 433 may be modified or changed without limiting the spirit or scope of the claims. As in FIG. 4A, the standoff 130 may have a base 331 with a flat or semi-flat face 410 to secure the standoff 130 in the channel 111 of the mounting assembly 110.

In some embodiments, the standoff 130 may be made of plastic or other non-metal material. For example, the standoff 100 may be injection molded plastic. One advantage of a plastic standoff 130 is that it can be used to electrically insulate the circuit board from the chassis 100 if desired. Alternatively, if grounding is desired, a metal standoff 130 may be used to electrically ground the chassis 100. Those of ordinary skill in the art will readily appreciate that, in addition to plastic and metal, the standoff 130 may also be made of other materials, depending on the desire to either electrically insulate the circuit board 220 or electrically ground the chassis 100. For example, other materials include, but are not limited to, any of the materials used in the manufacture and packaging of electronic devices. Therefore, the list of materials disclosed herein does not limit the spirit or scope of the claims.

In the foregoing specification, the invention has been described with reference to specific embodiments thereof. It will, however, be evident that various modifications and changes may be made thereto without departing from the broader spirit and scope of the invention. For example, the reader is to understand that the specific sizes, materials and shapes described herein are merely illustrative, and the invention can be performed using different or additional ones. For example, each feature of one embodiment can be mixed and matched with other features shown in other embodiments. Features and processes known to those of ordinary skill in the art of networking may similarly be incorporated as desired. Additionally and obviously, features may be added or subtracted as desired.

Accordingly, the invention is not to be restricted except in light of the attached claims and their equivalents.

We claim:

1. A system for supporting a circuit board in a chassis, comprising:
   a chassis;
   a circuit board;
   a standoff mounted on the chassis for supporting the circuit board on the chassis;
   wherein a channel is formed on one of the chassis and the circuit board, the channel having opposite ends; and
   wherein the standoff is received in the channel and the standoff is movable in the channel; and
   wherein the channel has ends, and at least one of the ends is permanently closed at both ends of the channel to prevent movement of the standoff through either of the permanently closed ends.

2. The system of clam 1 wherein the standoff is movable with respect to one of the chassis and the circuit board.

3. The system of claim 1 wherein the standoff has a tap formed therein.

4. The system of claim 1 wherein the standoff includes a post with a detent.

5. The system of claim 4 wherein the detent is located toward a free end of the post of the standoff.

6. The system of claim 4 wherein the detent is positioned above an upper surface of the circuit board.

7. The system of claim 1 wherein the standoff is movable along the channel to a desired position for securing the circuit board to the standoff.

8. The system of claim 1 wherein the standoff has a post with a groove.

9. The system of claim 1 wherein the channel is formed by a pair of opposing edges extending substantially parallel to each other along a portion of a length of the channel, each of the opposing edges converging together at each of the opposite ends of the channel.

10. The system of claim 1 wherein the standoff is freely slidable between the opposite ends of the channel.

11. A method for mounting a circuit board on a chassis using a standoff mounted on the chassis, comprising:
    providing a channel in one of the chassis and the circuit board, the channel having opposite ends with both of the ends being permanently closed;
    positioning the circuit board in the chassis adjacent to the standoff; and
    moving the standoff and the circuit board relative to each other in a direction extending substantially parallel to a plane oriented substantially perpendicular to a longitudinal axis of the standoff.

12. The method of claim 11 wherein the step of moving the standoff and the circuit board relative to each other comprises shifting the standoff relative to the circuit board.

13. The method of claim 11 further comprising the step of inserting the standoff through a mounting hole in the circuit board.

14. The method of claim 13 wherein the step of inserting the standoff into the mounting hole is performed after the step of moving the standoff and the circuit board relative to each other.

15. A system for supporting a circuit board in a chassis, comprising:
    a chassis;
    a circuit board;
    a standoff mounted on the chassis for supporting the circuit board on the chassis;
    a channel formed on one of the chassis and the circuit board, the channel having opposite sides, opposite ends, and a width between the opposite sides;
    the standoff being receivable in the channel such that the standoff is movable in the channel;
    the width of the channel tapering narrower towards at least one of the ends of the channel.

16. The system of claim 15 wherein the width of the channel tapers narrower towards both of the ends of the channel.

* * * * *